US 7,274,190 B2

United States Patent
Harvey

(10) Patent No.: US 7,274,190 B2
(45) Date of Patent: Sep. 25, 2007

(54) METHOD OF MONITORING A MAGNETIC FIELD DRIFT OF A MAGNETIC RESONANCE IMAGING APPARATUS

(75) Inventor: Paul Royston Harvey, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/571,746

(22) PCT Filed: Aug. 27, 2004

(86) PCT No.: PCT/IB2004/051583

§ 371 (c)(1), (2), (4) Date: Mar. 14, 2006

(87) PCT Pub. No.: WO2005/026764

PCT Pub. Date: Mar. 24, 2005

(65) Prior Publication Data

US 2007/0024282 A1 Feb. 1, 2007

(30) Foreign Application Priority Data

Sep. 16, 2003 (EP) .................................. 03103404

(51) Int. Cl.
*G01V 3/00* (2006.01)
(52) U.S. Cl. ..................... 324/318; 324/309
(58) Field of Classification Search ........ 324/300–322; 600/407–445
See application file for complete search history.

(56) References Cited

U.S. PATENT DOCUMENTS 4,833,408 A * 5/1989 Yamamoto et al. ......... 324/309
4,970,457 A * 11/1990 Kaufman et al. ........... 324/309
5,914,601 A * 6/1999 Goldfarb .................... 324/322
6,294,913 B1 * 9/2001 Hinks et al. ................ 324/309
2007/0024282 A1 * 2/2007 Harvey ....................... 324/310

FOREIGN PATENT DOCUMENTS

| DE | 100 32 345 A1 | 1/2002 |
| EP | 1 143 258 A2 | 10/2001 |
| EP | 1 178 327 A2 | 2/2002 |
| JP | 2002/017706 | 1/2002 |
| JP | 2003-61927 | 3/2003 |
| WO | WO 00/54069 | 9/2000 |

* cited by examiner

*Primary Examiner*—Brij B. Shrivastav

(57) ABSTRACT

The invention enables to monitor a magnetic field drift of a magnetic resonance imaging apparatus on the basis of the magnetic resonance signals, which are acquired during magnetic resonance image data acquisition, such as by single shot EPI or by a gradient echo sequence. The phases of at least two magnetic resonance signals are acquired an echo time after the corresponding RF excitations. This corresponds to the central k-space line, which has frequency encoding but no phase encoding. The difference of two consecutive phase measurements, which are acquired at a certain time interval provides the shift of the resonance frequency. This enables monitoring of the shift of the resonance frequency and compensation of the magnetic field drift.

20 Claims, 4 Drawing Sheets

US 7,274,190 B2

METHOD OF MONITORING A MAGNETIC FIELD DRIFT OF A MAGNETIC RESONANCE IMAGING APPARATUS

FIELD OF THE INVENTION

The present invention is related to the field of magnetic resonance imaging (MRI), and more particularly without limitation to magnetic field drift compensation.

BACKGROUND AND PRIOR ART

Prior art magnetic resonance imaging apparatus' generate a uniform magnetic field which is also referred to as the main field or the polarising field $B_0$. The purpose of the magnetic field is that the individual magnetic moments of the spins in the tissue to be visualised attempt to align with this polarising field, but precess about it in random order at a characteristic Larmor frequency which is determined by the gyromagnetic constant of the spins and the polarising magnetic field $B_0$.

However during operation of a magnetic resonance apparatus the magnetic field can vary over time due to various reasons. For example when the magnetic resonance apparatus is under heavy duty the passive iron shim pieces of the coils which generate the magnetic field heat up which leads to a fluctuation of the magnetic field.

U.S. Pat. No. 6,294,913b1 shows a method for compensation of variations in the polarising magnetic field during magnetic resonance imaging. Monitor signals are acquired in an interleaved manner during a scan with the MRI system. Frequency changes caused by variations in the polarising magnetic field $B_0$ are measured using the monitor signals, and these measured frequency changes are employed to compensate image data acquired during the scan. This compensation is achieved by changing the frequency of the RF transmitter and receiver to offset the effects of changes in $B_0$. A disadvantage of this compensation method is that special monitor signals are required for the compensation.

It is therefore an object of the present invention to provide for an improved method of monitoring and compensating a magnetic field drift.

SUMMARY OF THE INVENTION

The present invention provides for a method of monitoring a magnetic field drift of a magnetic resonance imaging apparatus which does not require special monitor signals or monitor sensors. Rather the method of the invention can be performed on the basis of the magnetic resonance signals which are acquired during magnetic resonance image data acquisition, such as by single shot EPI or by a gradient echo sequence.

In essence the phases of at least two magnetic resonance signals are acquired an echo time after the corresponding RF excitations. This corresponds to the central k-space line which has frequency encoding but no phase encoding. This central k-space is usually designated as $k_y=0$. The difference of two consecutive phase measurements which are acquired at a certain time interval provides the shift of the resonance frequency. This enables monitoring of the shift of the resonance frequency and compensation of the magnetic field drift.

In accordance with a further preferred embodiment of the invention a single shot EPI method is used for the magnetic resonance data acquisition. Single shot EPI has the advantage that every data acquisition contains the $k_y=0$ line such that for each data acquisition the required phase information can be obtained.

In accordance with a further preferred embodiment of the invention a gradient echo sequence is used for the magnetic resonance image data acquisition. During such a gradient echo sequence the k-space is scanned along an arbitrary trajectory which typically also contains the k-space line $k_y=0$. For example a full gradient echo sequence has 256 data acquisitions one of which is representative of $k_y=0$. The data acquisition for $k_y=0$ enables to obtain the required phase information once for each complete gradient echo sequence.

In accordance with a further preferred embodiment of the invention extra scans along $k_y=0$ are performed during a gradient echo sequence in order to obtain multiple phases during the complete sequence. This enables to monitor a magnetic field drift which occurs during a single gradient echo sequence.

BRIEF DESCRIPTION OF THE DRAWINGS

In the following preferred embodiments of the invention will be described in greater detail by making reference to the drawings in which.

DETAILED DESCRIPTION

Figure 1:
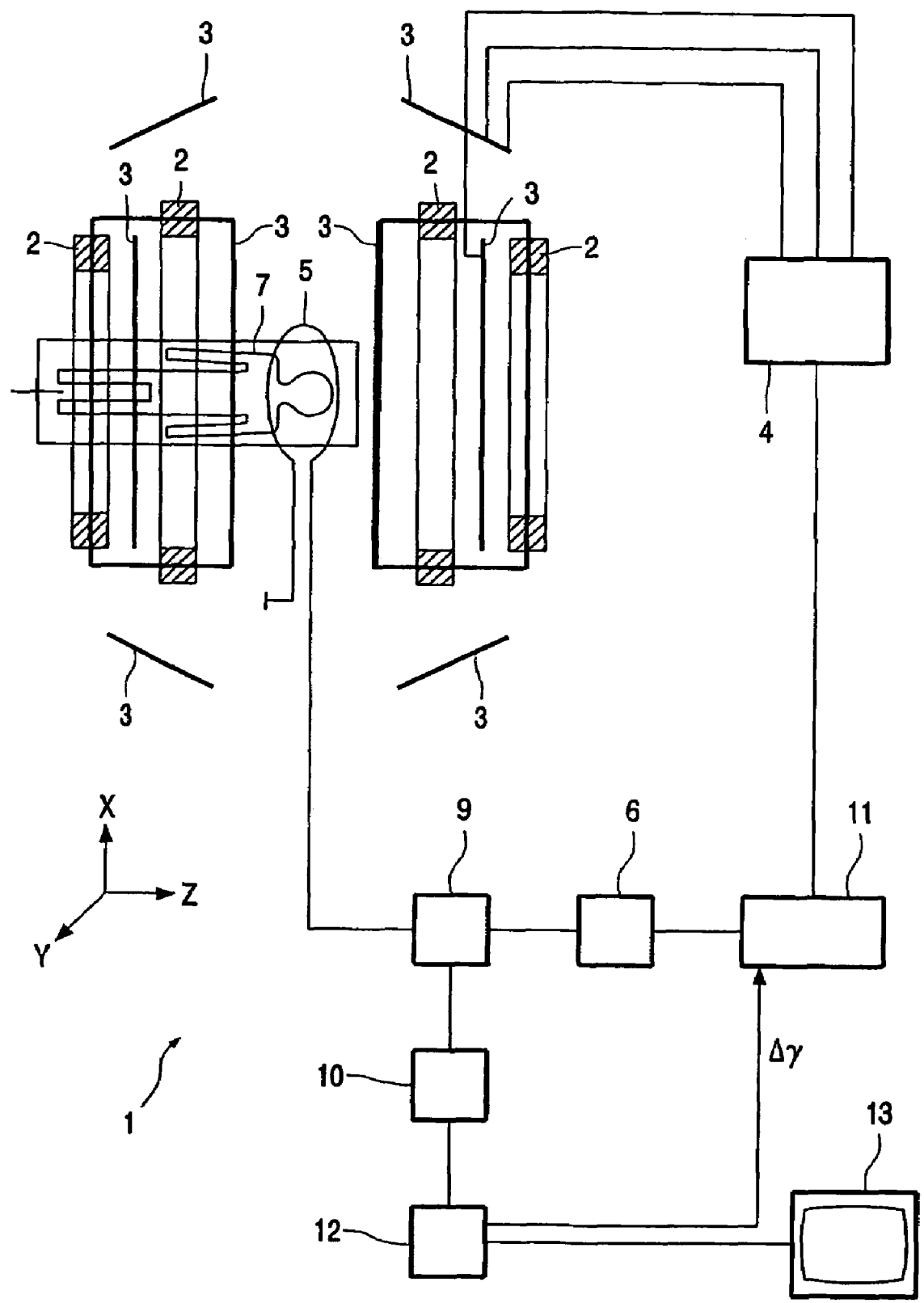
FIG. 1 shows a block diagram of a magnetic resonance apparatus with magnetic field drift compensation.

FIG. 1 shows a magnetic resonance device 1 which includes a first magnet system 2 for generating a steady magnetic field, and also several gradient coils 3 for generating additional magnetic fields having a gradient in the X, Y, Z directions. The Z direction of the co-ordinate system shown corresponds to the direction of the steady magnetic field in the magnet system 2 by convention. The measuring co-ordinate system x, y, z to be used can be chosen independently of the X, Y, Z system shown in FIG. 3. The gradient coils are fed by a power supply unit 4. An RF transmitter coil 5 serves to generate RF magnetic excitation pulses and is connected to an RF transmitter and modulator 6.

A receiver coil is used to receive the magnetic resonance signal generated by the RF field in the object 7 to be examined, for example a human or animal body. This coil may be the same coil as the RF transmitter coil 5. Furthermore, the magnet system 2 encloses an examination space which is large enough to accommodate a part of the body 7 to be examined. The RF coil 5 is arranged around or on the part of the body 7 to be examined in this examination space. The RF transmitter coil 5 is connected to a signal amplifier and demodulation unit 10 via a transmission/reception circuit 9.

The control unit 11 controls the RF transmitter and modulator 6 and the power supply unit 4 so as to generate special pulse sequences which contain RF pulses and gradients. The phase and amplitude obtained from the demodulation unit 10 are applied to a processing unit 12. The processing unit 12 processes the presented signal values (also referred to as k-space) so as to form an image by transformation. This image can be visualized, for example by means of a monitor 13.

Processing unit 12 determines a shift $\Delta f$ of the resonance frequency on the basis of the phase information obtained from the demodulation unit and provides the shift $\Delta f$ to the control unit 11 for compensation of the shift.

The acquisition of the required phase information is explained in more detail in the following by making reference to FIG. 2. First an RF magnetic excitation pulse 200 is generated by the transmitter coil (cf. transmitter coil 5 of FIG. 1). Further a slice selecting gradient $G_z$ pulse 202, a bipolar switched gradient 204, and a phase encoding gradient 206 are applied. The application of these gradients 202, 204 and 206 for single shot EPI magnetic resonance data acquisition is as such known from the prior art.

The single shot EPI provides measurement signal 208. The peak of measurement signal 208 is the echo time TE after the RF magnetic excitation pulse 200. The phase of measurement signal 208 at time TE with respect to the RF magnetic excitation pulse 200 is determined for the purpose of monitoring a drift of the magnetic field and a corresponding drift of the resonance frequency. In order to determine the resonance frequency drift, if any, the phase of the measurement signal 208 is determined again at a subsequent single shot EPI. The phase difference between the single shot EPIs enables to calculate the shift of the resonance frequency. This will be explained in greater detail by making reference to FIG. 3.

Figure 3:
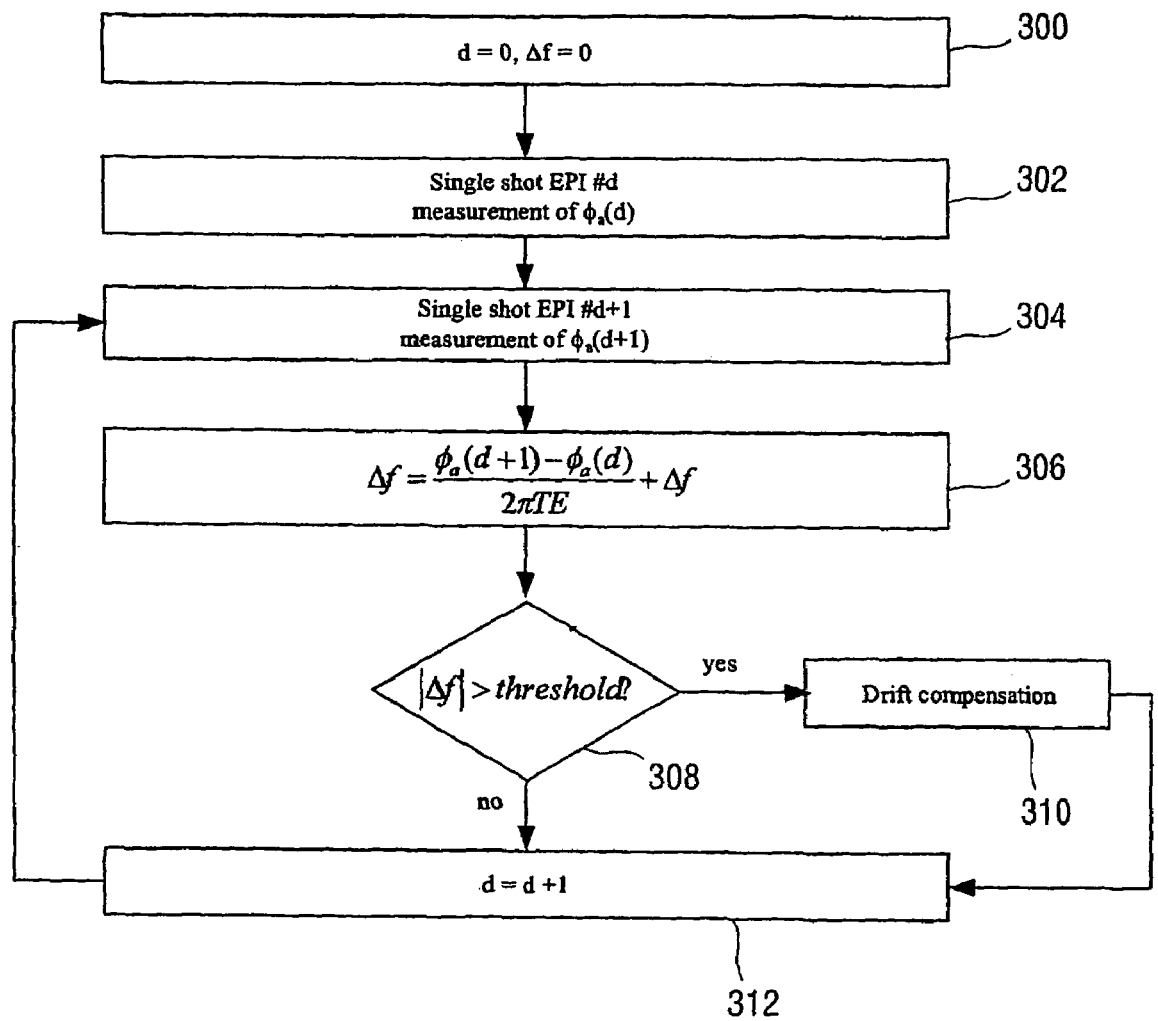
FIG. 3 is illustrative of a flow chart for monitoring and compensating the magnetic field drift in the case of single shot EPI.

The phase information at time TE can be obtained from the measurement signal 208 in the time domain or in the frequency domain which requires to perform a Fourier transformation on measurement signal 208. The required phase information corresponds to a central line of the k-space which is usually referred to as $k_y=0$, i.e. a scan with frequency encoding but without phase encoding. The fact that there is no phase encoding enables to use drifts of the phase information obtained from the measurement signal 208 for determination of the resonance frequency shift FIG. 3 shows a flow chart for monitoring and compensating of a magnetic field drift in the case of single shot EPI. In step 300 the index d is set to zero. The shift of the resonance frequency $\Delta f$ is also set to zero in step 300.

Figure 2:
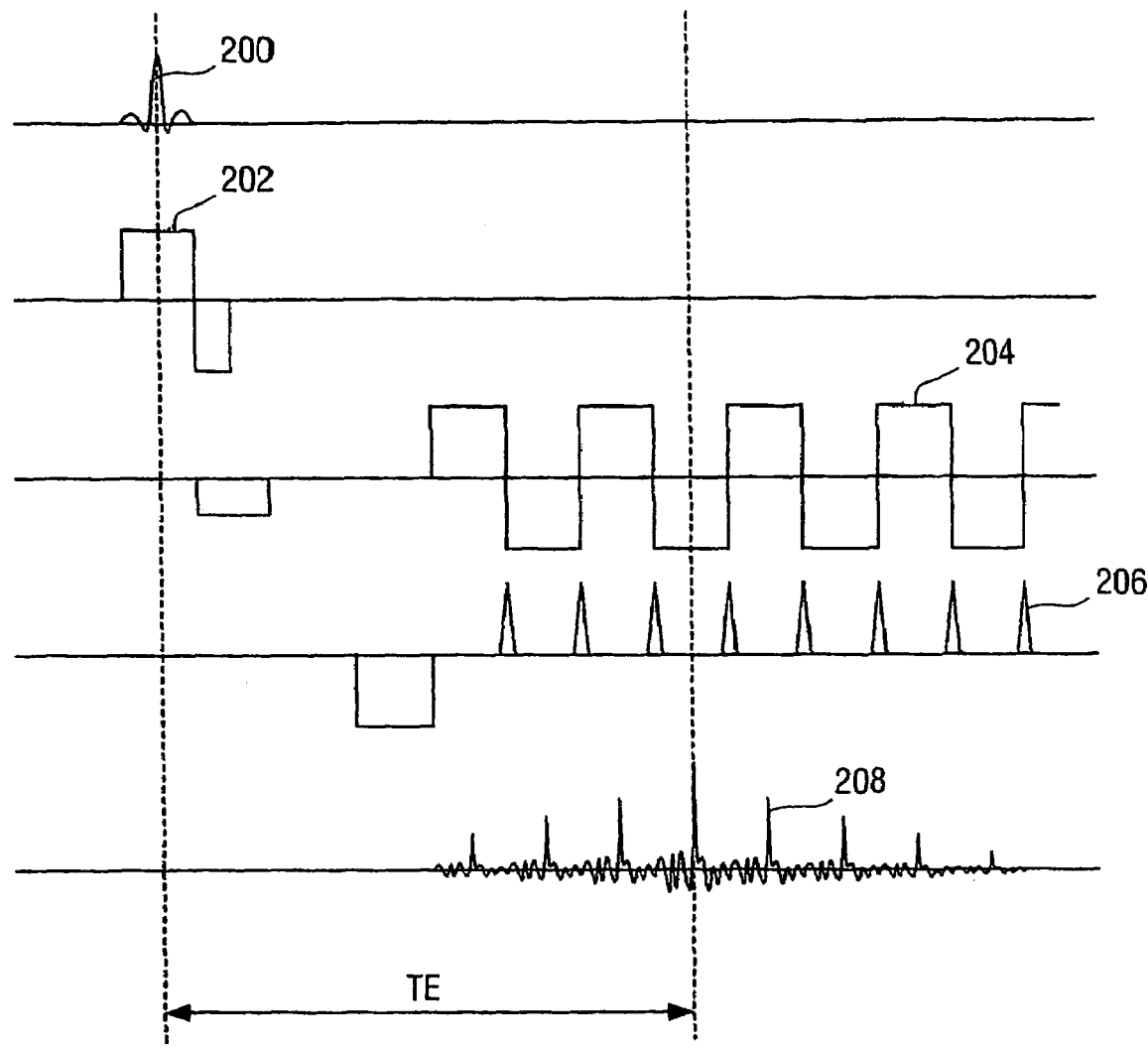
FIG. 2 is illustrative of the phase determination for a single shot EPI.

In step 302 the first single shot EPI is performed and the measurement of the phase $\Phi_a(d)$ is performed as explained with respect to FIG. 2.

The time interval of TE after the first single shot EPI is performed in step 302 the second single shot EPI is performed in step 304. Again the phase $\Phi_a$ is measured.

In step 306 a shift $\Delta f$ of the resonance frequency is calculated by calculating the difference between the phases $\Phi_a$ which have been acquired in steps 302 and 304 and by dividing the difference by $2\pi \times$ the time interval between the consecutive single shot EPIs. In this case this time interval is the echo time TE.

In step 308 the absolute value of the shift $\Delta f$ is compared to a threshold value. If the threshold value is surpassed a drift compensation is performed in step 310. Preferably this is done by adjusting the frequency of the RF magnetic excitation pulses to the shifted resonance frequency.

If the shift $\Delta f$ does not surpass the threshold no drift compensation is required. In step 312 the index d is incremented and the control goes back to step 304 for continuous monitoring the shift $\Delta f$.

Figure 4:
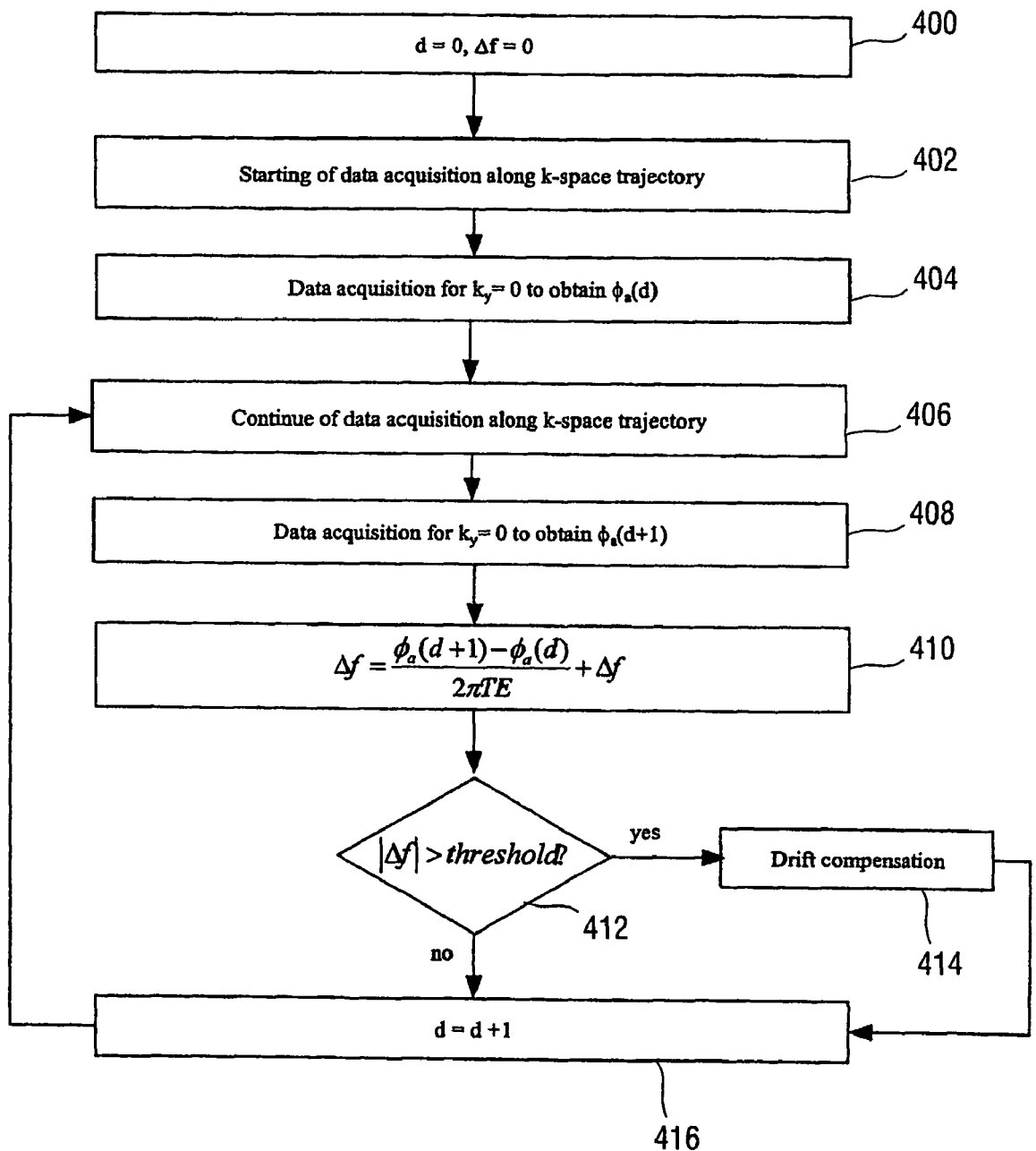
FIG. 4 is illustrative of a flow chart for magnetic field monitoring and compensation if a gradient echo sequence is employed.

FIG. 4 shows an alternative embodiment which uses a gradient echo sequence rather than single shot EPI. Step 400 corresponds to step 300 of FIG. 3. In step 402 the magnetic resonance data acquisition is started by starting to scan the k-space along a given trajectory. The trajectory may or may not cover the central line of the k space which is $k_y=0$.

In step 404 the scan of the k-space along the trajectory is interrupted in order to perform a data acquisition for the central k-space line with frequency encoding but no phase encoding, i.e. $k_y=0$. This way the phase information $\Phi_a$ is obtained.

In step 406 the scan along the k-space trajectory is continued. After a certain time interval the scan along the k-space trajectory is interrupted again in order to perform another data acquisition for $k_y=0$ to obtain another phase information $\Phi_a$.

In step 410 the shift of the resonance frequency is calculated by calculating the difference between the phases determined in steps 404 and 408 and by dividing the difference by $2\pi$ TE.

In step 412 the absolute value of the frequency shift $\Delta f$ is compared to a threshold value. If the threshold value is surpassed drift compensation is performed in step 414. In step 416 the index d is incremented and the control goes back to step 406 in order to continue the scan along the k-space trajectory. This procedure continues during the entire gradient echo sequence for continuously monitoring the shift of the resonance frequency and compensating the drift of the magnetic field if necessary.

The RF pulses of this modified gradient echo MRI sequence are applied at a single frequency (for a single slice); the phase measured at the echo (without encoding gradients) reflects only the phase difference accumulated between the RF pulse and the TE in case that the NMR resonant frequency (due to B0) is not equal to the excitation frequency (excluding susceptibility and chemical shift effects). When the magnet B0 is such that the NMR resonant frequency is the same as the excitation frequency of the RF pulse then the phase error accumulated between RF pulse and TE will be zero or constant from TR to TR. When the B0 is such that it corresponds to a different resonant frequency than the one the RF pulse is exciting, then the phase error accumulated between RF pulse and TE will be a finite value (proportional to the difference and TE). At the peak of each RF pulse, all magnetization is in phase, irrespective of the B0. Only after this time does the B0 have an effect on the magnetization.

So, each RF pulse behaves like a phase reset (as far as the f0 measurement process is concerned). The relative phase error (relative to zero at the RF pulse peak) at the TE increases as B0 moves further from the RF excitation frequency. Other mechanisms (chemical shift, susceptibility) can contribute to the phase error measured at the TE. Assuming that these other contributors to phase error are constant from TR to TR, the change in B0 can be determined by calculating the difference in phase errors between data acquired form two different TR's.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof

LIST OF REFERENCE NUMERALS 1 magnetic resonance device
2 magnet system 3 gradient coil
4 supply unit
5 transmitter coil
6 modulator
7 object
9 transmission/reception circuit
10 demodulation unit
11 control unit
12 processing unit
13 monitor
200 RF magnetic excitation pulse
202 slice selection gradient $G_z$ pulse
204 bipolar switched gradient
206 phase encoding gradient
208 measurement signal

The invention claimed is:

1. A method of compensating for MR image distortion attributable to a magnetic field drift of a magnetic resonance imaging apparatus, the method comprising the steps of:
performing a first data acquisition by a first magnetic resonance signal corresponding to a central k-space line as first echo time after a first excitation,
determining a first phase of the first magnetic resonance signal,
performing a second data acquisition by a second magnetic resonance signal corresponding to the central k-space line a time interval after the first data acquisition and a second echo time after a second excitation,
determining a second phase of the second magnetic resonance signal,
determining a shift of a resonance frequency based on a difference of the first and second phases and the first and second echo times,
applying the determined resonance frequency shift to compensate for the magnetic field drift,
acquiring a plurality of magnetic resonance signals corresponding to the central and a plurality of other k-space data lines and compensated for the magnetic field drift,
generating a magnetic field drift compensated MR image from the plurality of acquired magnetic resonance signals.

2. The method of claim 1, whereby the first and second data acquisition are performed using a signal shot EPI method.

3. The method of claim 1, whereby the first and second data acquisitions are performed by means of a gradient echo sequence method.

4. The method of claim 3, whereby a k-space is scanned and second data acquisitions are performed intermittently to determine second phases in order to continuously monitor the shift of the resonance frequency.

5. The method of claim 4, whereby the second data acquisitions are performed after fixed time intervals.

6. The method of claim 1, further comprising compensating the magnetic field drift by changing the frequency of the excitation in accordance with the shift of the resonance frequency.

7. A method of compensating for magnetic field drift during magnetic resonance imaging, the method comprising:
exciting magnetic resonance in a magnetic field,
collecting magnetic resonance echoes phase-encoded to each of a plurality of lines of k-space with an EPI or gradient echo sequence,
determining a first phase of a first magnetic resonance echo corresponding to a selected one of the k-space lines at a first echo time after exciting the magnetic resonance,
determining a second phase of a second magnetic resonance echo corresponding to the selected one of the k-space lines at a second echo time after exciting the magnetic resonance,
determining a magnetic field drift based on the first and second phases and the first and second echo times,
compensating for the magnetic field drift by adjusting the magnetic field,
generating an image from the magnetic resonance echoes collected at least partially with the adjusted magnetic field to compensate for magnetic field drift.

8. The method of claim 1, further comprising comparing the shift of the resonance frequency to a threshold value and compensating the magnetic field drift if the threshold value is surpassed.

9. The method of claim 1, whereby the first and second phases are determined in the time domain.

10. The method of claim 1, further comprising performing a Fourier transformation of the first and second magnetic resonance signals and determining the first and second phases in the frequency domain.

11. A computer program product, in particular digital storage medium, for monitoring a magnetic field shift of a magnetic resonance imaging apparatus and generating magnetic field shift compensated diagnostic images, the computer program product comprising program means being adapted to perform the steps of:
determining a first phase of a first magnetic resonance signal corresponding to a preselected line of k-space an echo time after a first excitation,
determining a second phase of a second magnetic resonance signal corresponding to the reselected lines of k-space the echo time after a second excitation, whereby the second magnetic resonance signal is acquired a time interval after the first magnetic resonance signal,
calculating a shift of a resonance frequency based on a difference of the first and second phases,
compensating for the shift of the resonance frequency,
reconstructing a diagnostic image from magnetic resonance signals corresponding to the preselected and other lines of k-space compensated for the shift of the resonance frequency.

12. The computer program product of claim 11, the program means being adapted to continuously monitor the shift of the resonance frequency.

13. The computer program product of claim 11, the program means being adapted to control an excitation synthesiser in accordance with the shift of the resonance frequency.

14. The computer program product of claim 11, the program means being adapted to control the magnetic field in accordance with the shift of the resonance frequency.

15. A magnetic resonance imaging apparatus comprising processing means:
for determining a first phase of a first occurrence of a reselected line of k-space an echo time after a first excitation,
for determining a second phase of a second occurrence of the preselected line of k-space, the second occurrence of the preselected line of k-space being acquired a time interval after the first occurrence of the preselected line of k-space, for calculating a shift of a resonance frequency based on a difference of the first and second phases and the time interval, and for reconstructing an image from a plurality of lines of k-space compensated for the calculated resonance frequency phase shift.

16. The magnetic resonance imaging apparatus of claim 15 having display means for displaying at least one of the shift of the resonance frequency and the shift compensated image.

17. The magnetic resonance imaging apparatus of claims 15, further comprising control means for controlling the generation of the excitations in accordance with the shift of the resonance frequency.

18. The magnetic resonance imaging apparatus of claim 15, further comprising control means for controlling of the magnetic field in accordance with the shift of the resonance frequency.

19. The computer program product of claim 11, wherein the preselected line of k-space is a zero-phased line (k=0).

20. The magnetic resonance imaging apparatus of claim 15, whereon calculating the resonance frequency shift includes:

dividing the difference of the first and second phases by $2\pi$ times the time interval.

* * * * *